United States Patent
Sasaki et al.

(10) Patent No.: US 8,318,238 B2
(45) Date of Patent: Nov. 27, 2012

(54) FILM POSITION ADJUSTING METHOD, MEMORY MEDIUM AND SUBSTRATE PROCESSING SYSTEM

(75) Inventors: Yoshiaki Sasaki, Nirasaki (JP); Hirofumi Yamaguchi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 842 days.

(21) Appl. No.: 12/298,570

(22) PCT Filed: Apr. 26, 2007

(86) PCT No.: PCT/JP2007/059098
§ 371 (c)(1),
(2), (4) Date: Oct. 27, 2008

(87) PCT Pub. No.: WO2007/126016
PCT Pub. Date: Nov. 8, 2007

(65) Prior Publication Data
US 2009/0087542 A1    Apr. 2, 2009

(30) Foreign Application Priority Data
Apr. 26, 2006  (JP) .................................. 2006-122436

(51) Int. Cl.
*C23C 16/52*  (2006.01)
*C23C 16/00*  (2006.01)
(52) U.S. Cl. ........................................ 427/8; 427/248.1
(58) Field of Classification Search ............ 427/8, 248.1
See application file for complete search history.

(56) References Cited

U.S. PATENT DOCUMENTS

| 5,264,918 A * | 11/1993 | Kagami ........................ 356/400 |
| 5,565,034 A | 10/1996 | Nanbu et al. |
| 5,725,664 A | 3/1998 | Nanbu et al. |
| 6,054,181 A | 4/2000 | Nanbu et al. |
| 2005/0016818 A1 * | 1/2005 | Ito et al. ...................... 198/345.1 |

FOREIGN PATENT DOCUMENTS

| JP | 7 130721 | 5/1995 |
| JP | 7 142459 | 6/1995 |
| JP | 07142459 A * | 6/1995 |

* cited by examiner

*Primary Examiner* — Kelly M Gambetta
(74) *Attorney, Agent, or Firm* — Oblon, Spivak, McClelland, Maier & Neustadt, L.L.P.

(57) ABSTRACT

A substrate processing system includes a processing chamber 12, and an orienter 16 centering a wafer W. The orienter 16 is provided with an orienter sensor 42 measuring a central position discrepancy of the wafer W, and an image sensor 41 measuring a width of a non-film forming portion at circumferential portions of the wafer W. After a film deposition processing in the processing chamber 12, the wafer W is loaded into the orienter 16 where a central position discrepancy of the wafer W is measured, and the wafer W is then centered. Further, the width of the non-film forming portion of the wafer W is measured, and a film position discrepancy is calculated based on the width of the non-film forming portion. To correct the calculated film position discrepancy, a target transfer position of the wafer W on a mounting table 13 in the processing chamber 12 is adjusted.

11 Claims, 6 Drawing Sheets

FILM POSITION ADJUSTING METHOD, MEMORY MEDIUM AND SUBSTRATE PROCESSING SYSTEM

FIELD OF THE INVENTION

The present invention relates to a film position adjusting method, a storage medium and a substrate processing system; and, more particularly, to a film position adjusting method for correcting a discrepancy of a position of a film formed on a surface of a substrate.

BACKGROUND OF THE INVENTION

There is a substrate processing system having a processing chamber for forming an insulating film or a metal film for forming wiring or the like by CVD (Chemical Vapor Deposits) on a surface of a circular plate-shaped wafer as a substrate. In this substrate processing system, when a film is formed in a substantially circular shape on the wafer surface, it is preferable that the center of the wafer coincides with that of the film. However, a discrepancy of an actual film forming position (an actual film position where a film is formed by treatment) with respect to a reference film forming position (a target film position where a film should be formed) (hereinafter, referred to as a "film position discrepancy") may be generated due to a discrepancy occurring during wafer transfer or due to a variation in plasma distribution in the processing chamber (see FIG. 6).

In order to correct the film position discrepancy, the position of the wafer on the mounting table is adjusted in the processing chamber. To be specific, when the film position is discrepant, the position of the wafer with respect to the plasma in the processing chamber is adjusted by adjusting the position of the wafer on the mounting table by using of a transfer arm (transfer unit) transferring the wafer.

Since the size of the film is smaller than that of the wafer, a non-film forming portion where a film is not formed on the wafer surface (see FIG. 6) is generated on the wafer surface. The film position discrepancy is calculated by measuring the width of the non-film forming portions in several locations of the wafer.

The width of the non-film forming portion of the wafer is measured by using a metallographic microscope after the wafer is unloaded from the substrate processing system by an operator. To be specific, the width is measured on a peripheral portion of the substrate at locations which are 90° apart in a circumference direction by using the metallographic microscope.

However, the measurement using a metallographic microscope is disadvantageous in that the wafer needs to be unloaded from the substrate processing system by an operator as described above and also in that the film position discrepancy calculated from the width of the non-film forming portion needs to be inputted to the substrate processing system by the operator. Besides, since an allowable film position discrepancy of about 0.2 mm the influence of measurement error can be large, so that the position of the wafer needs to be measured and adjusted repetitively. Namely, a considerable period of time is required to correct the film position discrepancy.

SUMMARY OF THE INVENTION

In view of the above, the present invention provides a technique capable of correcting a discrepancy between a position of a formed film and a reference position of a film.

In accordance with one aspect of the invention, there is provided a film position adjusting method for use in a substrate processing system, which includes a film forming apparatus for forming a film on a surface of a substrate, a centering device for centering the substrate, and a control unit, the centering device having a position discrepancy measuring sensor for measuring a discrepancy of a central position of the substrate and an image sensor for measuring a non-film forming portion where the film is not formed on the surface of the substrate.

The film position adjusting method includes a film forming step of forming the film on the substrate by the film forming apparatus; a width measuring step of measuring, by using the image sensor, widths of the non-film forming portion on the substrate on which the film is formed in the film forming; a film position discrepancy calculating step of calculating, by using the control unit, a position discrepancy of the film formed on the substrate with respect to a reference film forming position based on the widths of the non-film forming portion measured in the width measuring step; and a substrate position adjusting step of adjusting, by using the control unit, a position of the substrate in the film forming apparatus based on the position discrepancy calculated in the film position discrepancy calculating step.

In accordance with the present invention, it is unnecessary to unload the substrate from the substrate processing system and, also, the operator does not need to input the calculated position discrepancy to the substrate processing system. Moreover, since the width of the non-film forming portion is measured not by the operator but by the image sensor, the measurement error is small. Accordingly, the discrepancy between a formed film position and a reference position of a film can be easily corrected.

The substrate and the film may have substantially circular shapes, and, in the width measuring step, the widths of the non-film forming portion may be measured on a peripheral portion of the substrate at locations which are 90° apart in a circumference direction.

Since the width of the non-film forming portion is measured on a peripheral portion of the substrate at locations which are 90° apart in a circumference direction, it is possible to easily calculate the central position of the formed film so that the discrepancy between a formed film position and a reference position of a film can be easily calculated.

Preferably, the film position adjusting method further includes, after the film forming step, a central position discrepancy measuring step of measuring the discrepancy of the central position of the substrate by the position discrepancy measuring sensor.

Since the discrepancy of the central position of the substrate is measured in addition to the film position discrepancy, it is possible to determine whether the film position discrepancy is caused by the improper position of the substrate in the film forming apparatus or by the improper position (position discrepancy) of a member provided at the peripheral portion of the mounting table for mounting thereon the substrate in the film forming apparatus.

Preferably, the film position adjusting method further includes, before the film forming step, a centering step of centering the substrate by the centering device.

The centering of the substrate is performed before the film is formed on the substrate surface. After the film is formed, the discrepancy caused during transfer of the substrate in the substrate processing system can be measured by measuring the discrepancy of the central position of the substrate.

Accordingly, the cause of the discrepancy between a position of a formed film and a reference position of a film can be identified in detail.

Preferably, the film position adjusting method further includes, between the film forming step and the width measuring step, a centering step of centering the substrate by the centering device.

Accordingly, it is possible to prevent the non-film forming portion from being deviated from the range where an image can be recognized by the image sensor and, thus, the width of the non-film forming portion can be effectively measured.

In accordance with a second aspect of the present invention a computer readable storage medium storing a computer executable program of a film position adjusting method for use in a substrate processing system, which includes a film forming apparatus for forming a film on a surface of a substrate, a centering device for centering the substrate and a control unit, the centering device having a position discrepancy measuring sensor for measuring a discrepancy of a central position of the substrate and an image sensor for measuring a non-film forming portion where the film is not formed on the surface of the substrate.

The program includes a film forming module for forming the film on the substrate by the film forming apparatus, a width measuring module for measuring widths of the non-film forming portion by the image sensor, a film position discrepancy calculating module for calculating, by using the control unit, a position discrepancy of the film formed on the substrate with respect to a reference film forming position based on the widths of the non-film forming portion, and a substrate position adjusting module for adjusting, by using the control unit, a position of the substrate in the film forming apparatus based on the calculated position discrepancy.

In accordance with a third aspect of the present invention a substrate processing system including a film forming apparatus for forming a film on a surface of a substrate, a centering device for centering the substrate, and a control unit. The centering device includes a position discrepancy measuring sensor for measuring a discrepancy of a central position of the substrate and an image sensor for recognizing an image of a non-film forming portion where the film is not formed on the surface of the substrate on which the film is formed by the film forming device and measuring widths of the non-film forming portion.

The control unit is configured to calculate a position discrepancy of the film formed on the substrate with respect to a reference film forming position based on the measured widths of the non-film forming portion and then adjust the position of the substrate in the film forming apparatus based on the calculated position discrepancy.

DETAILED DESCRIPTION OF THE EMBODIMENT

The embodiments of the present invention will be described with reference to the accompanying drawings which form a part hereof.

Figure 1:
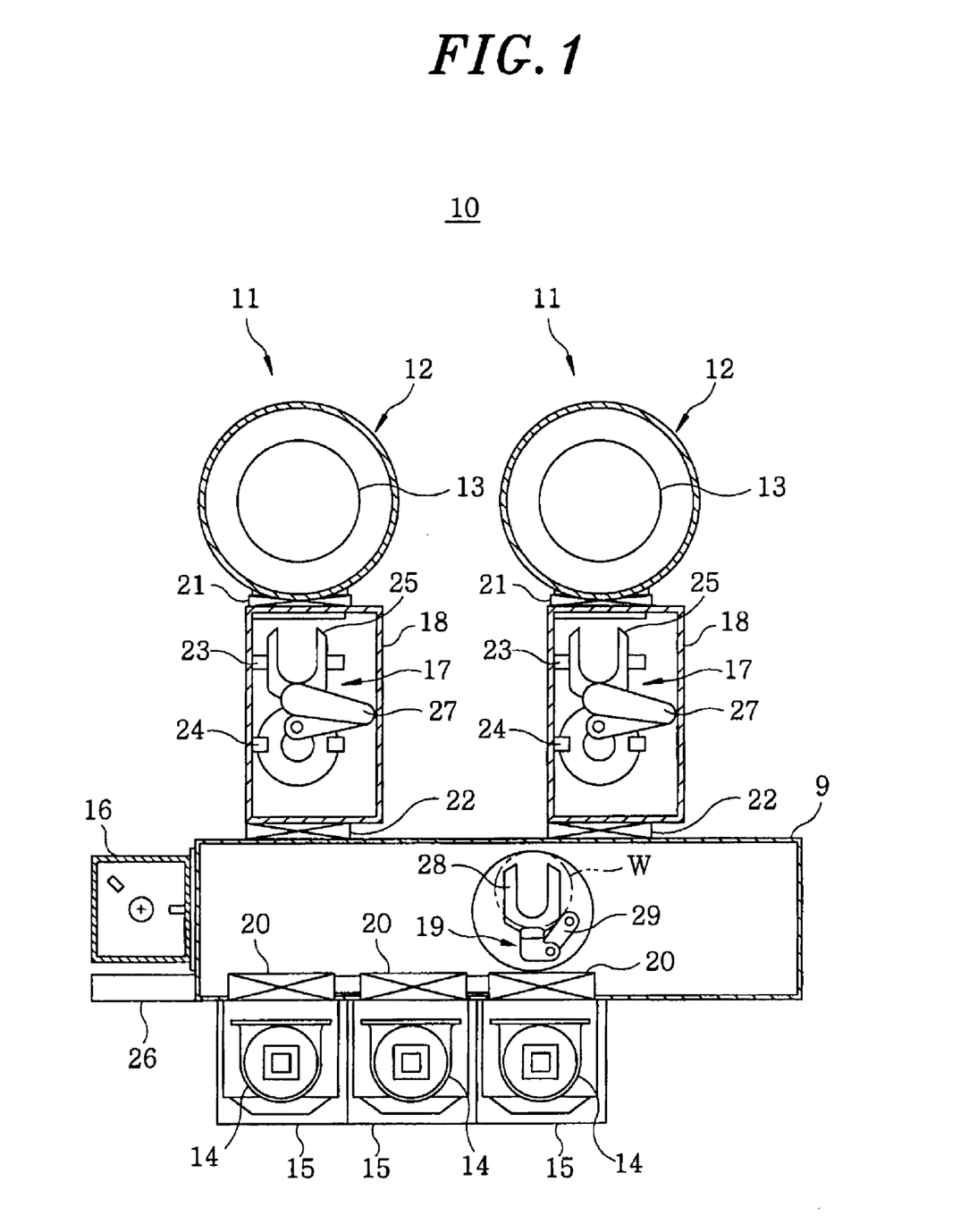
FIG. 1 is a top view schematically showing a configuration of a substrate processing system in accordance with an embodiment of the present invention.

First of all, a substrate processing system in accordance with an embodiment of the present invention will be described. FIG. 1 is a top view schematically showing a configuration of a substrate processing system in accordance with an embodiment of the present invention.

As shown in FIG. 1, the substrate processing system 10 includes a plurality of process ships 11 for performing a film forming process using a plasma, such as CVD treatment, on to a circular plate-shaped wafer W, and a loader module 9 as a common transfer chamber having a square cross section, the process ships 11 being connected to the loader module 9.

Further, the loader module 9 has connected thereto three FOUP mounting tables 15 on each of which is mounted a FOUP (front opening unified pod) 14 as a container for housing twenty-five wafers W, and an orienter (centering device) 16 for carrying out centering of each wafer W unloaded from the FOUP 14.

The process ships 11 are connected to one side wall extending in a longitudinal direction of the loader module 9, and are disposed to face the three FOUP mounting tables 15 with the loader module 9 provided therebetween. The orienter 16 is disposed at a longitudinal end of the loader module 9.

Disposed in the loader module 9 is a substrate transfer unit 19 for transferring wafers W. Three loading ports 20 serving as input ports of the wafers W are disposed in the other side wall extending in the longitudinal direction of the loader module 9 in correspondence with the FOUP mounting tables 15. The substrate transfer unit 19 has an arm 29 capable of rotating and extending/retracting in a horizontal direction and a bifurcated transfer fork 28 which is connected to a leading end portion of the arm 29 for supporting a wafer W. The substrate transfer unit 19 moves the transfer fork 28 supporting a wafer W by extending, contracting and rotating the arm 29, thereby transferring the wafer W. The substrate transfer unit 19 unloads a wafer W from a FOUP 14 mounted on a FOUP mounting table 15 through the loading port 20, and then transfers the unloaded wafer W to the process ship 11 or the orienter 16.

Each of the process ships 11 includes a processing chamber 12 as a vacuum processing chamber where the wafer W is CVD treated, and a load lock module 18 having therein a substrate transfer unit 17 for transferring the wafer W into the processing chamber 12.

The processing chamber 12 has a processing gas introducing unit (not shown) for introducing processing gas into the processing chamber 12 or a high frequency electrode (not shown) for applying a high frequency power into the processing chamber 12. By performing the CVD treatment using the plasma generated from the processing gas introduced into the processing chamber 12, a film, e.g., an insulating film or a metal film for wiring or the like, is formed in a circular shape on the surface of the wafer W.

Provided in the processing chamber 12 are a mounting table 13 for mounting thereon a wafer W and a ring (a member disposed around the mounting table 13) (not shown) for concentrating the plasma toward the wafer W mounted on the mounting table 13, the ring being disposed to face the mounting table 13. This ring is referred to as a focus ring. The plasma distribution near the wafer W is affected by the position of the ring.

Thus, when the relative positional relationship between the ring and the wafer W on the mounting table 13 is improper, e.g., when the position of the wafer W on the mounting table 13 or the position of the ring is improper, the film position discrepancy, i.e., the discrepancy of the actual film position (an actual film position where a film is formed by CVD treatment) with respect to the reference film position (a target film position where a film need to be formed) is generated. The substrate transfer unit 17 can adjust the position of the wafer W on the mounting table 13 by adjusting the transfer position of the wafer W on the mounting table 13. As a consequence, the relative positional relationship between the ring and the wafer W can be adjusted properly.

The internal pressure of the loader module 9 is held at atmospheric pressure, whereas the internal pressure of the processing chamber 12 is held at vacuum. The load lock module 18 is provided with a vacuum side of gate valve 21 in a connecting portion between the load lock module 18 and the processing chamber 12, and an atmospheric side of gate valve 22 in a connecting portion between the load lock module 18 and the loader module 9. Further, the load lock module 18 serves as a preliminary vacuum transfer chamber whose internal pressure can be adjusted.

Installed at a substantially central portion of the load lock module 18 is a substrate transfer unit 17. The substrate transfer unit 17 has an arm 27 capable of rotating and extending/retracting in a horizontal direction and a bifurcated transfer fork 25 which is connected to a leading end portion of the arm 27 for supporting a wafer W. The substrate transfer unit 17 moves the transfer fork 25 supporting a wafer W by extending, contracting and rotating the arm 27, thereby transferring the wafer W.

Within the load lock module 18, a first buffer 23 is disposed in a position near the processing chamber 12, and a second buffer 24 is disposed in a position near the loader module 9. The wafers W are temporarily supported by the first and second buffer 23 and 24, so that swapping over of the wafer W that has been CVD treated and a wafer W yet to be CVD treated can be carried out smoothly.

Moreover, the substrate processing system 10 includes a system controller (control unit) (see FIG. 2) for controlling operations of the component elements of the substrate processing system 10, such as the process ships 11, the loader module 9, the orienter 16 and the like, and an operation GUI (graphical user interface) 26 disposed at a longitudinal end of the loader module 9.

The system controller controls the operations of the component elements in accordance with a program corresponding to the CVD treatment. The operation GUI 26 has a touch panel display (not shown) formed of, e.g., an LCD (liquid crystal display). Operation states of the component elements are displayed on the touch panel display, and an operator's input is received via the touch panel display.

Figure 2:
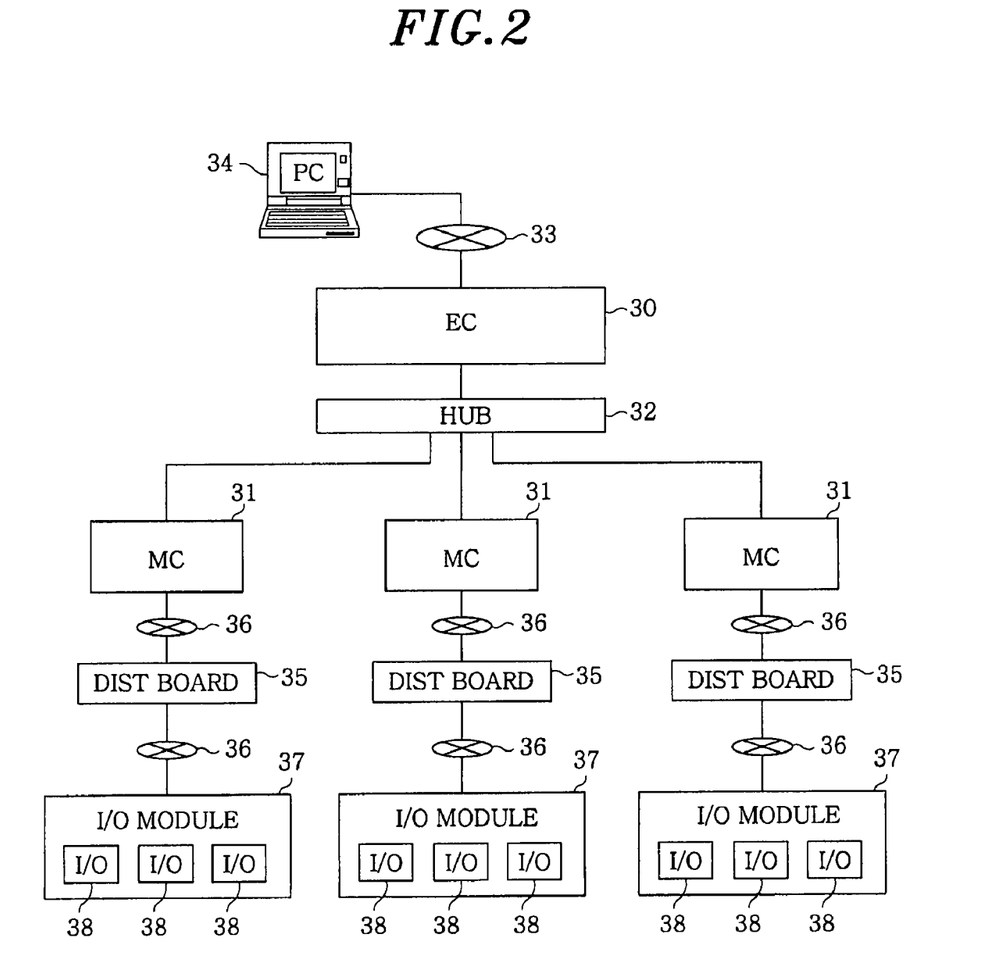
FIG. 2 describes a block diagram illustrating a configuration of a system controller for controlling operations of component elements of the substrate processing system in FIG. 1.

FIG. 2 illustrates a block diagram illustrating the configuration of the system controller for controlling the operations of the component elements of the substrate processing system in FIG. 1.

As shown in FIG. 2, the system controller has an EC (equipment controller) 30, a plurality of MCs (module controllers) 31, and a switching hub 32 connecting the EC 30 and the MCs 31. The EC 30 of the system controller is connected via a LAN (local area network) 33 to a PC 34 serving as an MES (manufacturing execution system) for performing overall control of the manufacturing processes in the manufacturing plant where the substrate processing system 10 is installed. In collaboration with the system controller, the MES feeds back real-time data on the processes in the manufacturing plant to a basic work system (not shown), and makes decisions related to the processes in view of the overall load on the manufacturing plant and the like.

The EC 30 is a main controller (master controller) for controlling the MCs 31 and carries out overall control of the operation of the substrate processing system 10. Further, the EC 30 has a CPU, a RAM, an HDD and the like, and sends control signals in accordance with programs corresponding to wafer W processing conditions, i.e. recipes, specified by a user via the operation GUI 26, thereby controlling the operations of the process ships 11, the loader module 9 and the orienter 16.

The switching hub 32 connects an MC 31 to the EC 30 according to the control signal from the EC 30.

The MCs 31 are sub controllers (slave controllers) for controlling the operations of the process ships 11, the loader module 9 and the orienter 16. Each of the MCs 31 is connected to an I/O (input/output) module 37 through a DIST (distribution) board 35 via a GHOST network 36. The GHOST network 36 is a network realized through an LSI called as a GHOST (general high-speed optimum scalable transceiver) mounted on an MC board of the each of the MCs 31. 31 I/O modules 37 can be connected at maximum to each GHOST network 36. With respect to the GHOST network 36, the MCs 31 are the master, and the I/O modules 37 are slaves.

Each of the I/O modules 37 has, e.g., a plurality of I/O units 38 connected to the component elements (hereinafter referred to as "end devices") of the process ships 11, and transmits control signals to the end devices and output signals from the end devices. Examples of the end devices connected to the I/O units 38 of the I/O module 37 are the mounting table 13 of the processing chamber 12, the processing gas introducing unit and the high frequency electrode.

Further, each GHOST network 36 is also connected to an I/O board (not shown) for controlling input/output of digital signals, analog signals and serial signals to/from the I/O units 38.

In the substrate processing system 10, when performing CVD treatment on a wafer W, the EC 30 executes the CVD treatment in the process ships 11 by sending the control signals to the end devices of the process ships 11 via the switching hub 32, the MCs 31, the GHOST network 36 and the I/O units 38 of the I/O module 37, in accordance with a program corresponding to the recipe for the CVD treatment.

In accordance with the system controller of FIG. 2, the plurality of end devices are not directly connected to the EC 30. That is, the I/O units 38 connected to the plurality of end devices are modularized to form an I/O module 37, and the corresponding I/O module 37 is connected to the EC 30 via the MC 31 and the switching hub 32. As a consequence, the communication system can be simplified.

Further, each of the control signals sent by the EC 30 contains the address of the I/O unit 38 connected to the desired end device and the address of the I/O module 37 including the corresponding I/O unit 38. Therefore, the switching hub 32 refers to the address of the I/O module 37 in the control signal, and the GHOST of the MC 31 refers to the address of the I/O unit 38 in the control signal. Accordingly, it is not required for the switching hub 32 or the MC 31 to ask the CPU for the sender of the control signal and, hence, smoother transmission of the control signals can be realized.

Figure 3:
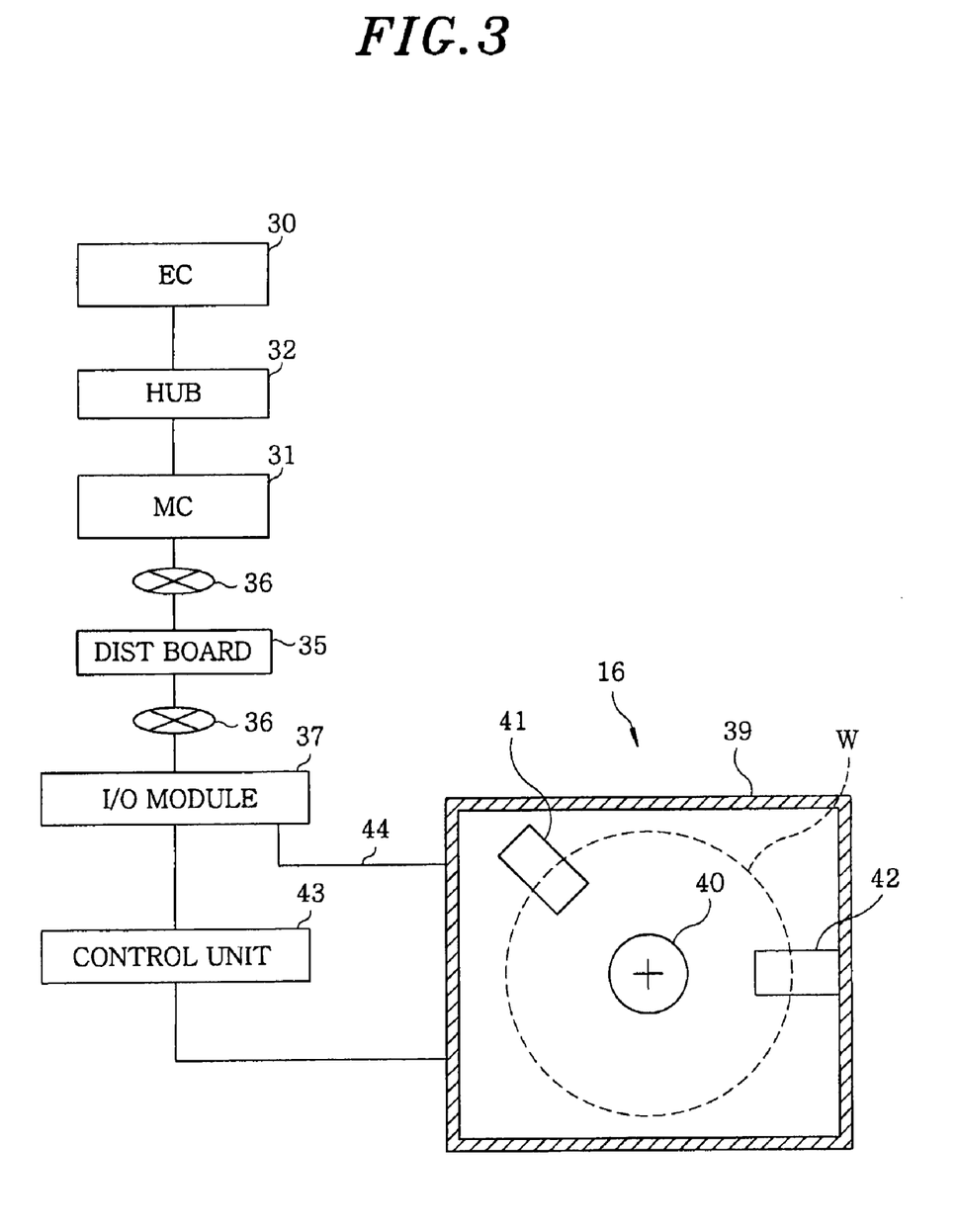
FIG. 3 provides a horizontal cross sectional view schematically describing a configuration of an orienter shown in FIG. 1.

FIG. 3 provides a horizontal cross sectional view schematically describing the configuration of the orienter shown in FIG. 1.

As can be seen from FIG. 3, the orienter 16 includes a housing 39, a rotatable support 40 provided at a substantially center of the housing 39, an image sensor 41 and an orienter sensor 42 disposed in correspondence with the peripheral portions of the wafer W mounted on the rotatable support 40 and a centering mechanism (not shown) for centering the wafer W mounted on the rotatable support 40 by using the substrate transfer unit 19.

By rotating the wafer W mounted on the rotatable support 40 on a horizontal plane, the peripheral position of the rotating wafer W is measured by the orienter sensor 42 and, accordingly, the discrepancy of the central position of the wafer W can be measured. After the discrepancy from the central position of the wafer W is measured by the orienter sensor 42, the substrate transfer unit 19 receives the wafer W from the rotatable support 40. Next, when the wafer W is transferred back to the rotatable support 40 by the substrate transfer unit 19, the transfer position of the wafer W to the rotatable support 40 which is controlled by the substrate transfer unit 19 is adjusted based on the measured discrepancy from the central position of the wafer W. In this manner, the centering mechanism performs the centering operation. That is, in the illustrated embodiment, the centering mechanism is realized by the control functions and the operations executed by the substrate transfer unit 19, the rotatable support 40, the orienter sensor 42 and the MCs 31 (and/or the EC 30).

The image sensor 41 recognizes the image of the peripheral portion of the wafer W. To be specific, the image sensor 41 recognizes the boundary between the film forming portion and the non-film forming portion based on the contrast of the obtained image, and then measures the width of the non-film forming portion. As for a commercial image sensor 41 having the above functions, there is known one manufactured by Cognex Corporation. Further, the image sensor 41 is disposed to face the peripheral portion of the wafer W that has been subjected to the centering on the rotatable support 40.

The orienter 16 is connected to an orienter control unit 43 for controlling operations of component elements of the orienter 16, such as the rotatable support 40 or the image sensor 41. The orienter control unit 43 is connected to the I/O units 38 of the I/O module 37 of the MC 31 which corresponds to the orienter 16 in the system controller shown in FIG. 2. Moreover, each component element of the orienter 16 is connected to the I/O units 38 of the I/O module 37 via an interlock signal line 44. An interlock signal as an operation stop signal of each component element of the orienter 16 is transmitted from the orienter 16 to the I/O module 37 via the interlock signal line 44.

Hereinafter, the film position adjusting method in accordance with an embodiment of the present invention will be described.

Figure 4:
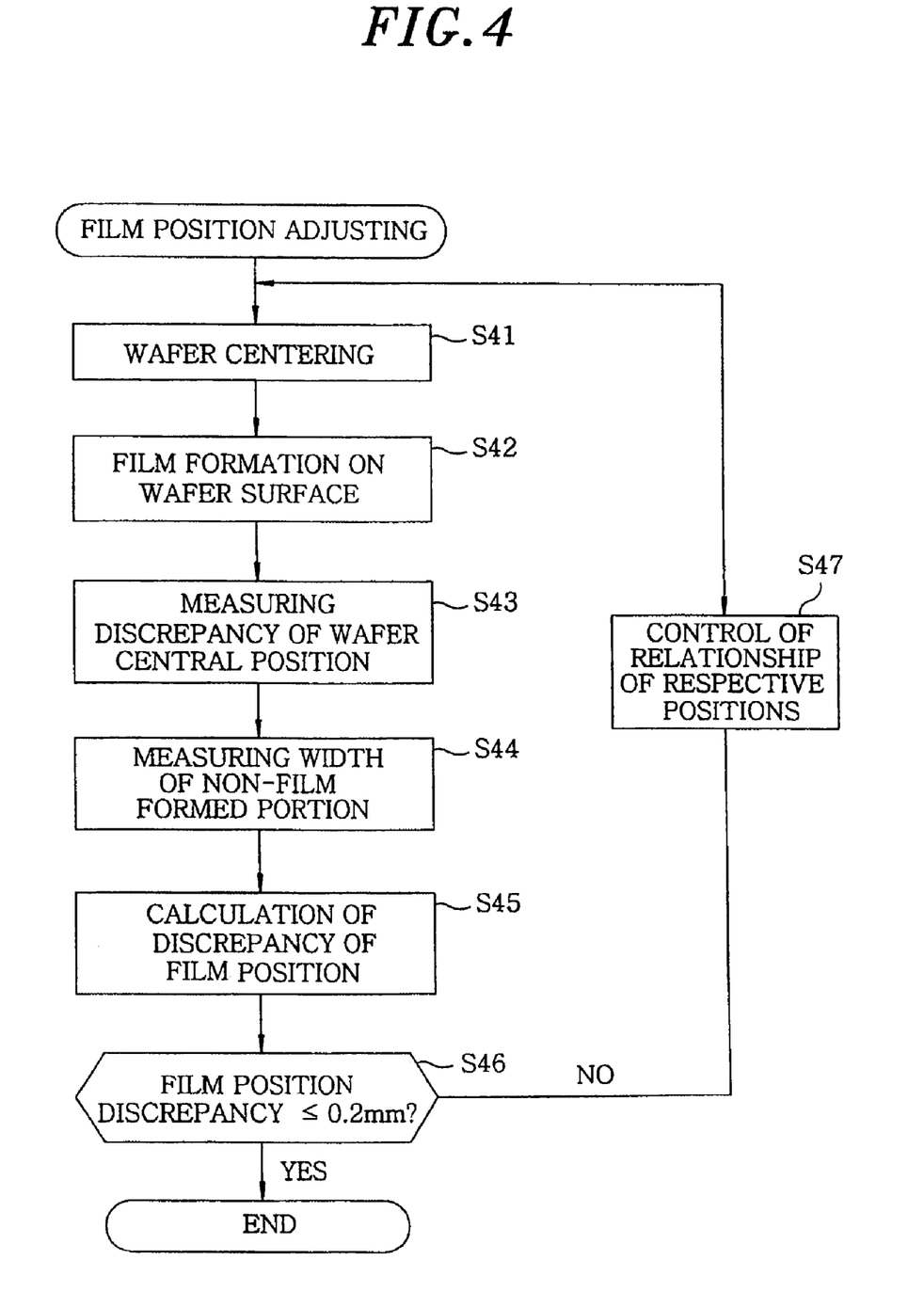
FIG. 4 presents a flow chart of a film position adjusting process performed in the substrate processing system of FIG. 1.

FIG. 4 presents a flow chart of the film position adjusting process performed in the substrate processing system in FIG. 1. This process is performed whenever the maintenance of the processing chamber 12, e.g., the replacement of the ring, is carried out.

As shown in FIG. 4, first of all, the wafer W unloaded form the FOUP 14 is loaded into the orienter 16, and the orienter 16 performs centering of the wafer W by using the centering mechanism (step S41).

Next, the wafer W that has been subjected to the centering is loaded into the processing chamber 12 and then CVD treated in the processing chamber 12, so that a film is formed on the surface of the wafer W (step S42). At this time, the CVD treatment is performed in accordance with a recipe different from a conventional process recipe so that the boundary between the film forming portion and the non-film forming portion can be clearly recognized. Accordingly, the contrast of the image obtained by the image sensor 41 of the orienter 16 increases and, thus, the image can be recognized with higher accuracy.

Thereafter, the wafer W formed with the film is loaded into the orienter 16, and the orienter 16 measures the discrepancy of the central position of the wafer W by the orienter sensor 42 (step S43). At this time, the centering of the wafer W may be carried out by the centering mechanism.

Then, the orienter 16 measures the width of the non-film forming portion by recognizing the image of the peripheral portion of the wafer W with the use of the image sensor 41 (step S44). At this time, the orienter 16 rotates the wafer W by the rotatable support 40, and the image sensor 41 measures the width of the non-film forming portion on a peripheral portion of the substrate at locations which are 90° apart in a circumference direction. Namely, the image sensor 41 measures the width of the non-film forming portion in four locations.

Thereafter, the orienter 16 sends to the EC 30 the discrepancy of the central position of the wafer W which is measured in the step S43 and the width of the non-film forming portion which is measured in the step S44. The EC 30 calculates the discrepancy of the central position of the formed film with respect to the central position of the wafer W, i.e., the film position discrepancy, based on the width of the non-film forming portion (step S45).

Next, if the calculated film position discrepancy is smaller than or equal to about 0.2 mm in step S46, the EC 30 completes this process. On the other hand, if the film position discrepancy is greater than about 0.2 mm, the EC 30 determines the cause of the film position discrepancy based on the film position discrepancy and the discrepancy of the central position of the wafer W. To be specific, when the discrepancy of the central position of the wafer W is large, it is likely that the discrepancy occurs during transfer of the wafer W. Therefore, it is determined that the mounting position of the wafer W on the mounting table 13 of the processing chamber 12 is improper. On the contrary, when the discrepancy of the central position of the wafer W is small, it is unlikely that the discrepancy occurs during transfer of the wafer W. Accordingly, it is determined that the position of the ring in the processing chamber 12 is improper.

Thereafter, the EC 30 transmits the film position discrepancy (information) to the MC 31 corresponding to the process ship 11 where the film formation has been carried out. The corresponding MC 31 calculates a position adjusting amount of the wafer W on the mounting table 13 to correct the film position discrepancy, and then adjusts the relative positional relationship between the wafer W on the mounting table 13 and the ring in the corresponding processing chamber 12 based on the calculated position adjusting amount (step S47). Next, the process returns to the step S41. As described above, the relative positional relationship can be adjusted by adjusting the transfer position of the wafer W on the mounting table 13 which is controlled by the substrate transfer unit 17. Thus, the transfer position of the wafer W (target transfer position of the wafer W) which stored in, e.g., the MC 31, is corrected in the step S47.

In the above processing of FIG. 4, the non-film forming portion of the wafer W is measured by the image sensor 41 of the orienter 16 in the substrate processing system 10; the film position discrepancy is calculated by the EC 30 based on the measured width of the non-film forming portion; and the relative positional relationship of the wafer W on the mounting table 13 and the ring in the processing chamber 12 is adjusted by the MC 31 based on the calculated film position discrepancy. Namely, it is unnecessary to unload the wafer W from the substrate processing system 10 and, also, an operator does not need to input the calculated film position discrepancy to the substrate processing system 10. Besides, since the width of the non-film forming portion is measured not by an operator but by the image sensor 41, the measurement error is small and, therefore, the film position discrepancy can be easily corrected.

The processing of FIG. 4 can be applied to each of the processing chambers 12. Therefore, as the number of processing chambers 12 of the substrate processing system 10 increases, the operator's efforts are reduced.

In the processing of FIG. 4, the width of the non-film forming portion is measured on a peripheral portion of the substrate at locations which are 90° apart in a circumference direction. Accordingly, the central position of the formed film can be easily calculated so that the film position discrepancy can be easily calculated.

In addition, since the discrepancy of the central position of the wafer W is measured in the processing of FIG. 4, it is possible to determine, when the film position discrepancy occurs, whether the film position discrepancy is caused by the improper mounting position of the wafer W on the mounting table 13 in the processing chamber 12 or by the improper position of the ring in the processing chamber 12.

When the image of the peripheral portion of the wafer W is recognized by the orienter 16, if the discrepancy of the central position of the wafer W is large, the non-film forming portion is deviated from the imaging range of the image sensor 41. To that end, in the processing of FIG. 4, the centering of the wafer W may be performed before the image of the peripheral portion of the wafer W is recognized by the image sensor 41. Accordingly, it is possible to prevent the non-film forming portion from being deviated form the imaging range of the image sensor 41 and the width of the non-film forming portion can be measured effectively.

Moreover, in the processing of FIG. 4, the centering of the wafer W is performed before the film is formed on the surface of the wafer W. Therefore, the discrepancy caused by transfer of the wafer W in the substrate processing system 10 can be measured by measuring the discrepancy of the central position of the wafer W after the film formation. As a result, the cause of the film position discrepancy can be identified in detail.

In the above processing of FIG. 4, the width of the non-film forming portion is measured in four locations by the image sensor 41. However, the number of measurement locations is not limited thereto, and may be any number as long as the central position of the formed film can be detected. For example, the width of the non-film forming portion can be measured in three locations at every 120° of circumference by the image sensor 41.

The processing of FIG. 4 can be applied to the case of performing an etching process on the wafer W as well as to the case of performing the film forming process on the wafer W. To be specific, in the wafer W that has been etched, the width of the non-etching portion in the peripheral portion of the wafer W is measured by the image sensor 41. Accordingly, a discrepancy of an actual etching region (circular region where etching has been actually performed) with respect to a reference etching region (etching target region) can be calculated and, thus, the position of the wafer W on the mounting table in the processing chamber for performing the etching process can be adjusted based on the calculated discrepancy.

In the above description, the processing of FIG. 4 is performed whenever the maintenance of the processing chamber 12 is carried out. However, the timing of performing the processing of FIG. 4 is not limited thereto. For example, it can be performed between manufacturing lots.

Figure 5:
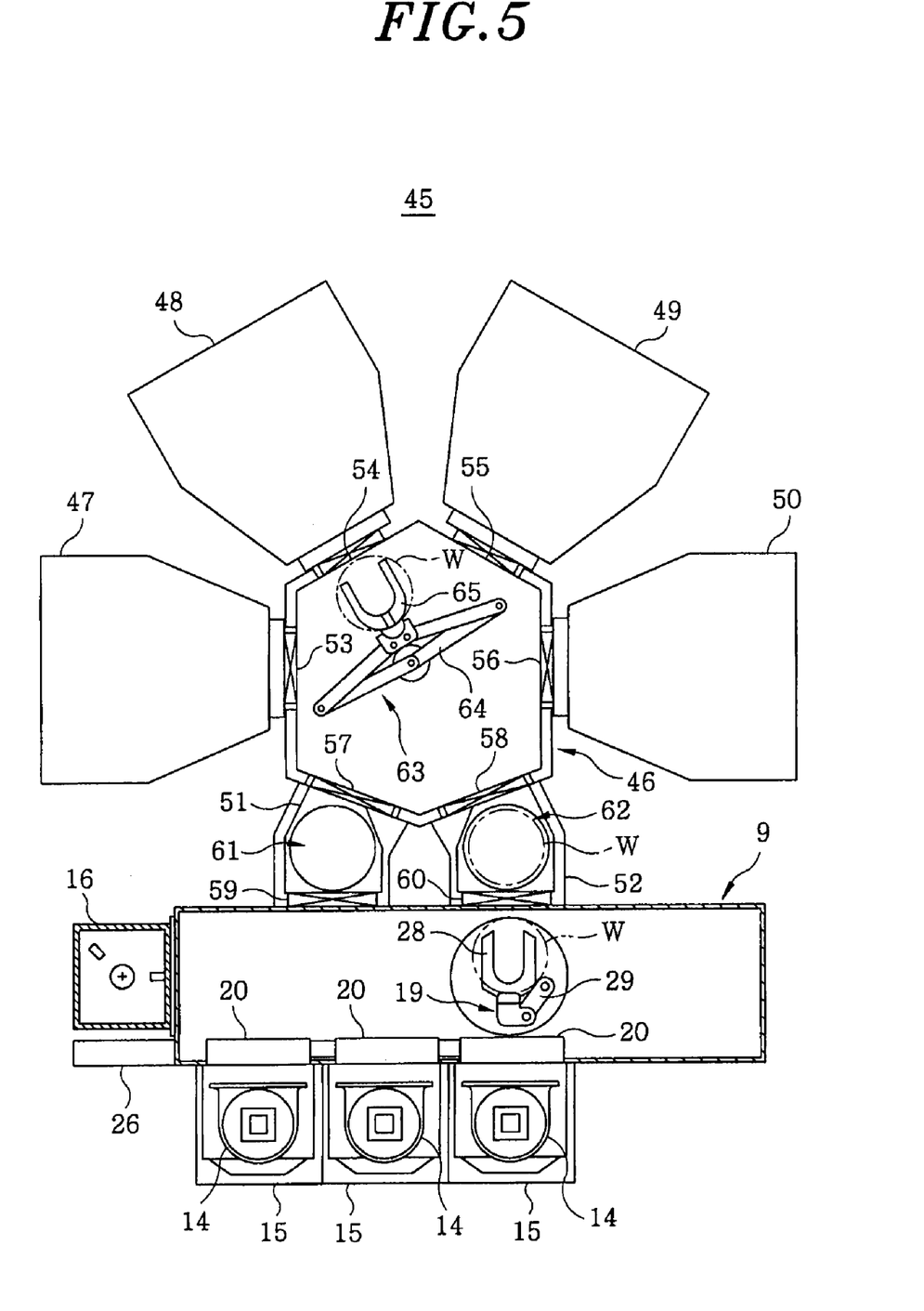
FIG. 5 depicts a top view schematically illustrating a configuration of another substrate processing system to which the film position adjusting method of the present invention is applicable.

The substrate processing system to which the film position adjusting method in accordance with the above-described embodiment is applied is not limited to a parallel-type substrate processing system having two process ships disposed parallel to each other as shown in FIG. 1, and may be a substrate processing system in which a plurality of process modules as vacuum processing chambers for performing CVD treatment on a wafer W are arranged in a radial shape as shown in FIG. 5.

FIG. 5 is a top view schematically illustrating a configuration of a modification of the substrate processing system to which the film position adjusting method of the present invention is applied. In FIG. 5, like reference numerals will be used for like parts identical to those of the substrate processing system 10 shown in FIG. 1, and redundant description thereof will be omitted.

As depicted in FIG. 5, a substrate processing system 45 includes: a transfer module 46 of a hexagonal shape seen from a top view; four process modules 47 to 50 arranged in a radial shape around the transfer module 46, for performing CVD treatment on a wafer W; a loader module 9 as a rectangular common transfer chamber; and two load lock modules 51 and 52 provided between the transfer module 46 and the loader module 9, for connecting the transfer module 46 and the loader module 9.

The internal pressures of the transfer module 46 and the process modules 47 to 50 are held at vacuum. Further, the transfer module 46 is connected to the process modules 47 to 50 via gate valves 53 to 56, respectively.

In the substrate processing system 45, the internal pressure of the loader module 9 is maintained at atmospheric pressure, whereas the internal pressure of the transfer module 46 is maintained at vacuum. Therefore, the load lock modules 51 and 52 are provided with gate valves 57 and 58 in connecting portions between the load lock modules 51 and 52 and the transfer module 46, and door valves 59 and 60 in connecting portions between the load lock modules 51 and 52 and the loader module 9. Accordingly, each of the load lock modules 51 and 52 is serves as a preliminary vacuum transfer chamber whose internal pressure can be adjusted. In addition, the load lock modules 51 and 52 are provided with mounting tables 61 and 62 for temporarily mounting thereon wafers W to be transferred between the loader module 9 and the transfer module 46.

The transfer module 46 has therein a frog leg-type substrate transfer unit 63 capable of contracting, extending and revolving. The substrate transfer unit 63 has an arm 64 capable of rotating and extending/contracting in a horizontal direction and a bifurcated transfer fork 65 which is connected to a leading end portion of the arm 64 and supports a wafer W. The substrate transfer unit 63 transfers the wafers W between the process modules 47 to 50 and the load lock modules 51 and 52.

Each of the process modules 47 to 50 has a mounting table (not shown) for mounting thereon a wafer W to be processed.

Here, the process modules 47 to 50 have the configuration same as that of the processing chamber 12 in the substrate processing system 10.

Further, the operations of the component elements in the substrate processing system 45 are controlled by the system controller having the configuration same as that of the system controller in the substrate processing system 10.

Each of the processing chambers in the substrate processing system to which the film position adjusting method in accordance with the above-described embodiment is applied is not limited to a vacuum transfer chamber for performing CVD treatment on a wafer W, and may be a processing chamber for forming a film on a surface of a wafer W in a semiconductor device manufacturing process. For example, it may be a processing chamber for performing PVD treatment or heat treatment on a wafer W.

Further, the substrate to be formed with a film on a surface thereof in the aforementioned substrate processing system 10 is not limited to a wafer for a semiconductor device, and may be various substrates for use in an LCD (Liquid Crystal Display), an FPD (Flat Panel Display) and the like, a photo mask, a CD substrate, a printed circuit board and the like.

The aforementioned method of the present invention can be performed by providing to the system controller a storage medium in which a program code of software that realizes the aforementioned various functions is stored, and making a computer (CPU, MPU, or the like) of the system controller to read out and execute the program code stored in the storage medium. Accordingly, the film position discrepancy and the wafer central position discrepancy can be calculated by the computer or the operation unit controlled by the computer, and the component elements (the process ships, the orienter, the transfer unit and the like) of the substrate processing system 10 can be controlled based on the control signals generated by the computer.

Moreover, the storage medium for supplying the program code may be, e.g., a floppy (registered trademark) disk, a hard disk, a magnetic-optical disk, an optical disk such as a CD-ROM, a CD-R, a CD-RW, a DVD-ROM, a DVD-RAM, a DVD-RW, or a DVD+RW, a magnetic tape, a non-volatile memory card, or a ROM. Alternatively, the program code may be downloaded via a network.

Besides, it is to be understood that the functions of the above-described embodiment may be accomplished by executing a program code read out by a computer and by operating an OS (operating system) or the like on the computer to perform a part or all of the actual operations based on instructions of the program code.

Further, it is to be understood that the functions of the embodiment described above may also be accomplished by writing a program code read out from the storage medium into a memory provided on an expansion board added into a computer or in an expansion unit connected to the computer, and then making a CPU or the like provided in the expansion board or in the expansion unit to perform a part or all of the actual operations based on instructions of the program code.

The form of the program code may be, e.g., object code, program code executed by an interpreter, script data transferred to an OS or the like.

Figure 6:
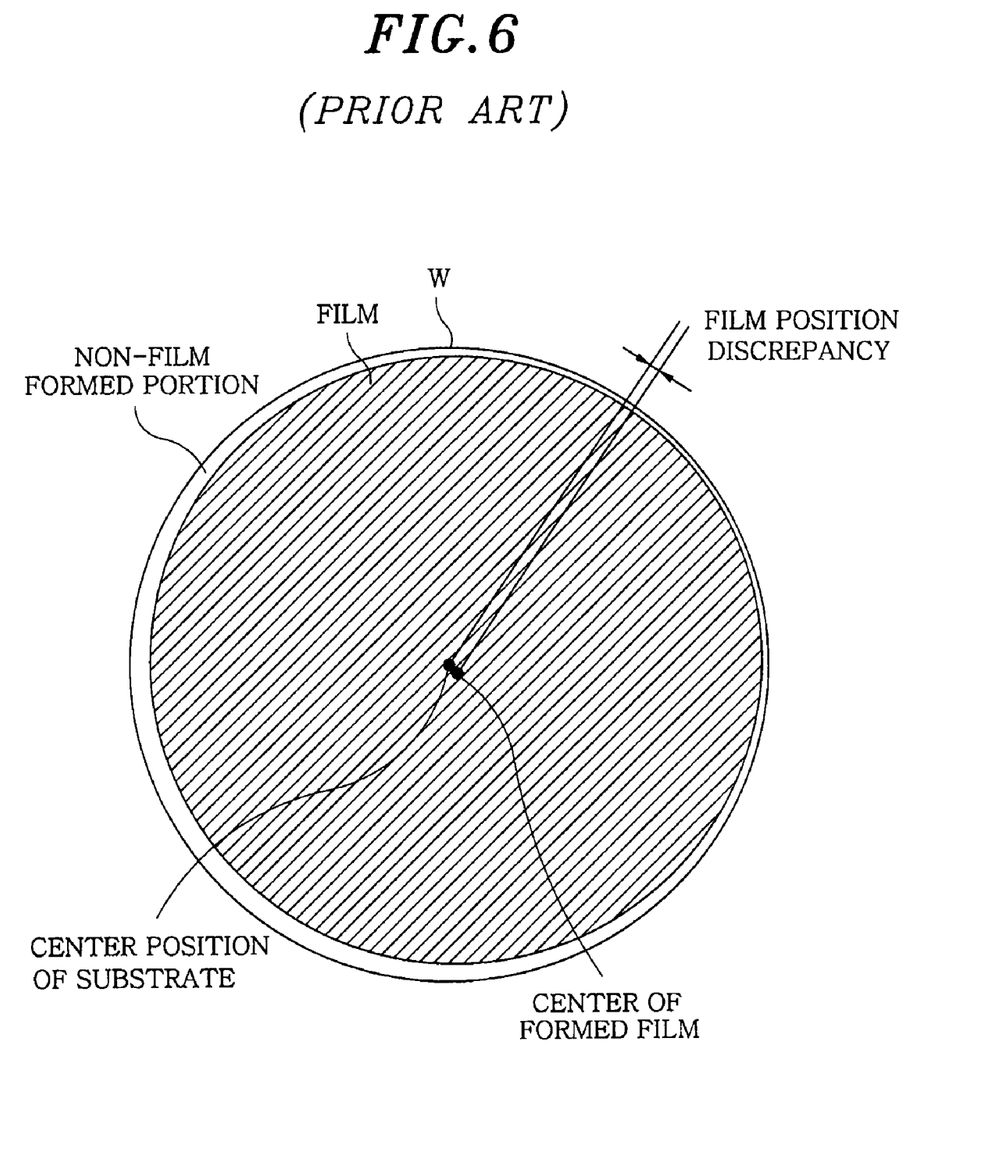
FIG. 6 offers a top view for explaining a position discrepancy of a formed film with respect to a reference position of a film.

Further, the film position adjusting method of the present invention can be applied to a film forming apparatus in which CVD treatment is performed in a state where a wafer (substrate) mounted on a mounting table is firmly pressed by a clamp ring. Since the clamp ring itself is well known to those having skilled in the art, the detailed description thereof will be omitted. The clamp ring has an inner diameter slightly smaller than an outer diameter of the wafer. Therefore, if the CVD treatment is performed in a state where the wafer is firmly pressed by the clamp ring, a non-film forming portion remains in the peripheral portion of the wafer covered by the clamp ring, as shown in FIG. 6. In this case as well, the film position discrepancy described in FIG. 6 may be generated. However, it can be corrected by the above-described film position adjusting method of the present invention.

Moreover, due to a fine gap existing between the clamp ring and the wafer, a film is slightly formed in a region of the wafer covered by the clamp ring by film forming gas being supplied to the fine gap. This may deteriorate the accuracy of measuring the width of the non-film forming portion by the image sensor 41 in the aforementioned step S44. Therefore, in order to ensure the high accuracy of measuring the width of the non-film forming portion, it is preferable to perform the aforementioned step S42 under the conditions of increasing the contrast between the film forming portion and the non-film forming portion in the image obtained by the image sensor 41.

As for a method for obtaining a high contrast image, a case where a W (tungsten) film is formed by CVD using $WF_6$ gas and $H_2$ gas will be described as an example. In a conventional film forming process, the film formation is carried out in a reaction rate controlled regime which has good burying characteristics. On the contrary, when the film position adjusting method of the present invention is performed, the film forming process of the above-described step S42 is carried out in a rate of arrival controlled regime which has good selectivity. Accordingly, it is possible to greatly reduce the amount of film formation on the region of the wafer covered by the clamp ring and, further, the contrast between the film forming portion and the non-film forming portion in the image obtained by the image sensor 41 can be increased. The reaction rate controlled regime and the rate of arrival controlled regime can be shifted by varying a supply ratio of $WF_6$ gas and $H_2$ gas. When the supply amount of $WF_6$ gas increases, the film forming reaction is shifted to the reaction rate controlled regime. When the supply amount of $WF_6$ gas decreases, the film forming reaction is shifted to the rate of arrival controlled regime.

While the invention has been shown and described with respect to the embodiments, it will be understood by those skilled in the art that various changes and modification may be made without departing from the scope of the invention as defined in the following claims.

What is claimed is:

1. A film position adjusting method for use in a substrate processing system, which includes a film forming apparatus, a centering device, and a control unit, the centering device having an image sensor, the film position adjusting method comprising the sequential steps of:

forming a test film on a surface of a test substrate by using the film forming apparatus in accordance with a test film processing condition, the surface of the test substrate including a film forming portion where the test film is formed during the test film forming step and a non-film forming portion where the test film is not formed during the test film forming step;

measuring, by using the image sensor, widths of the non-film forming portion;

calculating, by using the control unit, a center position discrepancy of the test film formed on the test substrate with respect to a center of the test substrate based on the widths of the non-film forming portion measured in the widths measuring step;

adjusting, by using the control unit, a position of a product substrate in the film forming apparatus based on the center position discrepancy; and forming a product film on a surface of the product substrate by using the film forming method apparatus in accordance with a product film processing condition, wherein the test film processing condition is different from the product film processing condition.

2. The film position adjusting method of claim 1, wherein the test substrate and the test film have substantially circular shapes, and, in the widths measuring step, the widths of the non-film forming portion are measured on a peripheral portion of the test substrate at locations which are 90° apart in a circumference direction.

3. The film position adjusting method of claim 1, wherein the centering device further has a position discrepancy measuring sensor, and the method further comprising, after the test film forming step, the step of measuring a discrepancy of the center of the test substrate by the position discrepancy measuring sensor.

4. The film position adjusting method of claim 1, further comprising, before the test film forming step, the step of centering the test substrate by the centering device.

5. The film position adjusting method of claim 1, further comprising, between the test film forming step and the widths measuring step, the step of centering the test substrate by the centering device.

6. The film position adjusting method of claim 1, further comprising the step of recognizing, with the image sensor, a boundary between the film forming portion and the non-film forming portion.

7. The film position adjusting method of claim 6, wherein the recognizing is based on a contrast between the film forming portion and the non-film forming portion in an image obtained by the image sensor.

8. The film position adjusting method of claim 1, wherein the widths measuring step includes recognizing an image of a peripheral portion of the test substrate with the image sensor.

9. The film position adjusting method of claim 1, wherein the film forming apparatus includes a mounting table on which the product substrate is mounted and step of the adjusting the position of the product substrate includes adjusting the position of the product substrate with respect to the mounting table.

10. A film position adjusting method for use in a substrate processing system, which includes a film forming apparatus, a centering device, and a control unit, the centering device having an image sensor, the film position adjusting method comprising the sequential steps of:

centering a test substrate by the centering device;

forming a test film on a surface of the test substrate by the film forming apparatus in accordance with a test film processing condition, the surface of the test substrate including a film forming portion where the test film is formed during the test film forming step and a non-film forming portion where the test film is not formed during the test film forming step;

measuring a discrepancy of a central position of the test substrate by a position discrepancy measuring sensor;

measuring, by using the image sensor, widths of the non-film forming portion;

calculating, by using the control unit, a center position discrepancy of the test film formed on the test substrate with respect to a center of the test substrate based on the widths of the non-film forming portion measured in the widths measuring step;

adjusting, by using the control unit, a position of a product substrate in the film forming apparatus based on the center position discrepancy of the test film; and forming a product film on a surface of the product substrate by using the film forming apparatus in accordance with a product film processing condition, wherein the test film processing condition is different from the product film processing condition.

11. A film position adjusting method for use in a substrate processing system, which includes a film forming apparatus, a centering device, and a control unit, the centering device having an image sensor, the film position adjusting method comprising the sequential steps of:

centering a test substrate by the centering device;

a film forming step of forming a test film on a surface of the test substrate by the film forming apparatus in accordance with a test film processing condition, the surface of the test substrate including a film forming portion where the test film is formed during the test film forming step and a non-film forming portion where the test film is not formed during the test film forming step;

measuring a discrepancy of a central position of the test substrate by a position discrepancy measuring sensor;

centering the test substrate by the centering device based on the discrepancy of the central position of the test substrate measured in the central position discrepancy measuring step;

measuring, by using the image sensor, widths of the non-film forming portion;

calculating, by using the control unit, a center position discrepancy of the test film formed on the test substrate with respect to a center of the test substrate based on the widths of the non-film forming portion measured in the widths measuring step; and adjusting, by using the control unit, a position of a product substrate in the film forming apparatus based on the center position discrepancy of the test film; and forming a product film on a surface of the product substrate by using the film forming apparatus in accordance with a product film processing condition, wherein the test film processing condition is different from the product film processing condition.

\* \* \* \* \*